United States Patent [19]
Cummings

[11] Patent Number: 6,007,948
[45] Date of Patent: Dec. 28, 1999

[54] METHOD OF FABRICATING X-RAY MASKS WITH REDUCED ERRORS

[75] Inventor: Kevin D. Cummings, Phoenix, Ariz.

[73] Assignee: Motorola, Inc., Schaumburg, Ill.

[21] Appl. No.: 08/654,456

[22] Filed: May 28, 1996

[51] Int. Cl.[6] .................................................. G03F 9/00
[52] U.S. Cl. ................................................ 430/5; 378/35
[58] Field of Search ........................... 430/5, 22; 378/34, 378/35; 250/492.22, 492.3

[56] References Cited

U.S. PATENT DOCUMENTS 4,621,371  11/1986  Gotou et al. ............................. 378/34

*Primary Examiner*—S. Rosasco
*Attorney, Agent, or Firm*—Eugene A. Parsons; William E. Koch

[57] ABSTRACT

A method of fabricating an X-ray mask including forming a membrane layer on a wafer and forming a layer of X-ray absorbing material on the membrane layer. A pattern is defined on the absorbing layer with positions that are predistorted in accordance with the following equations, and their extensions if desired:

$$\Delta Y = M_y Y + \delta Y$$

$$\Delta X = M_x X + \delta X$$

where:

$M_y$ and $M_x$ are the X and Y magnification errors;
$\delta Y$ includes the terms $\alpha X^4 + \beta X^2 + \gamma$ where,
  $\alpha$ includes the terms $a_1 Y^3 + a_2 Y$
  $\beta$ includes the terms $a_3 Y^3 + a_4 Y$
  $\gamma$ includes the terms $a_5 Y^3 + a_6 Y$;
and with corresponding equations for $\delta X$. The pattern is then formed in the absorbing layer to form an X-ray mask.

10 Claims, 3 Drawing Sheets

METHOD OF FABRICATING X-RAY MASKS WITH REDUCED ERRORS

FIELD OF THE INVENTION

The present invention pertains to fabrication processes for X-ray masks and more particularly to fabrication processes in which stress distortions are substantially reduced.

BACKGROUND OF THE INVENTION

Generally, for convenience and because standard semiconductor tools can be used in the fabrication process, X-ray masks are formed on a semiconductor wafer, such as a silicon wafer. The silicon wafer operates like a frame and support for the mask. A thin membrane is deposited on the upper surface of the wafer in the form of a thin layer. A layer of X-ray absorbing material, such as some safe heavy metal or alloy, is deposited on the upper surface of the membrane layer. The X-ray absorbing layer is patterned by applying a hard mask material and resist. The resist is patterned (or exposed) with an electron beam (E-beam) device and a hard mask is formed by etching the hard mask layer through the patterned photoresist layer. The hard mask is then used as an etch mask to pattern the X-ray absorbing layer. At some point in the process the wafer is etched from the membrane layer in a circle or a rectangle to form a thin membrane. The mask thus allows X-rays to pass through the thin membrane and portions of the X-ray absorbing layer that have been etched away. The entire procedure is known as a process flow and two different process flows are commonly used.

In the first process flow, commonly referred to as a wafer flow, all processing is done on the wafer with one of the final steps being the back etching of the silicon wafer to form the membrane. The wafer flow was primarily created to solve formatting issues. It allows X-ray mask processing to be conducted in semiconductor tools that are not dramatically different from the standard wafer processing tools supplied by the industry. The X-ray mask specific processing steps (membrane formation and wafer mounting to a support ring) are at the end of the flow. This minimizes the modifications necessary to both the tools and the wafer processes. However, the creation of the membrane and the mounting of the wafer creates significant pattern displacement errors (~0.15 µm) in the mask.

The second process flow is commonly referred to as a membrane flow. In the membrane flow the membrane is formed early in the process (generally after absorber deposition) and the remaining processing is carried out on the membrane. The membrane flow process was derived to remove the errors in the wafer flow process by conducting the mask specific processing steps before the absorber layer is patterned. While this greatly reduces the errors associated with membrane formation and wafer mounting, it also increases the modifications to both the equipment (the tools must accept an X-ray mask format rather than a wafer) and the processes (the patterning defining process steps are carried out on a membrane rather than a wafer).

The major problem in the formation of X-ray masks is that the membrane layer generally is formed with tension stress and the absorbing layer develops stresses during the process or flow. These stresses are altered radically by the patterning of the absorbing layer and by the removal of the portion of the wafer required to form the membrane. The various stresses produce distortions in the pattern, which distortions are, or result in, displacement of portions of the pattern. To offset these distortions the pattern written on the absorber is predistorted in an attempt to cancel the displacements. The problem is that while some of the major distortions have been offset, many residue or minor errors are not offset and, thus, greatly limit the accuracy and usefulness of X-ray masks.

It is a purpose of the present invention to provide new and improved methods of fabricating X-ray masks.

It is another purpose of the present invention to provide new and improved methods of fabricating X-ray masks which compensate for residual errors so as to greatly improve the accuracy.

It is a further purpose of the present invention to provide new and improved methods of fabricating X-ray masks including the use of a new function which can accurately describe the movement expected from all parts of a rectangular membrane in a simple closed form.

SUMMARY OF THE INVENTION

The above problems and others are at least partially solved and the above purposes and others are realized in a method of fabricating an X-ray mask with reduced errors including the steps of providing a wafer with a planar surface, forming a membrane layer on the planar surface of the wafer, and forming a layer of X-ray absorbing material on the membrane layer. A pattern is defined on the layer of X-ray absorbing material, which pattern has portions with positions that are predistorted in accordance with the following equations:

$$\Delta Y = M_y Y + \delta Y$$

$$\Delta X = M_x X + \delta X$$

where:

$M_y$ and $M_x$ are the X and Y magnification errors, respectively, and X and Y define a position on the mask;

$\delta Y$ includes the terms $\alpha X^4 + \beta X^2 + \gamma$ where, $\alpha$ includes the terms $a_1 Y^3 + a_2 Y$ $\beta$ includes the terms $a_3 Y^3 + a_4 Y$ $\gamma$ includes the terms $a_5 Y^3 + a_6 Y$; and $\delta X$ includes the terms $\alpha' Y^4 + \beta' Y^2 + \gamma$ where, $\alpha'$ includes the terms $a_7 X^3 + a_8 X$ $\beta'$ includes the terms $a_9 X^3 + a_{10} X$ $\gamma$ includes the terms $a_{11} X^3 + a_{12} X$ ($a_1$ through $a_{12}$ are constants), and the pattern is formed in the layer of X-ray absorbing material to form an X-ray mask.

A portion of the wafer adjacent and coextensive with the rectangular membrane area is removed either prior to or subsequent to the step of forming the pattern through the layer of X-ray absorbing material to complete the X-ray mask.

BRIEF DESCRIPTION OF THE DRAWINGS

Referring to the drawings.

DESCRIPTION OF THE PREFERRED EMBODIMENT

Figure 1:
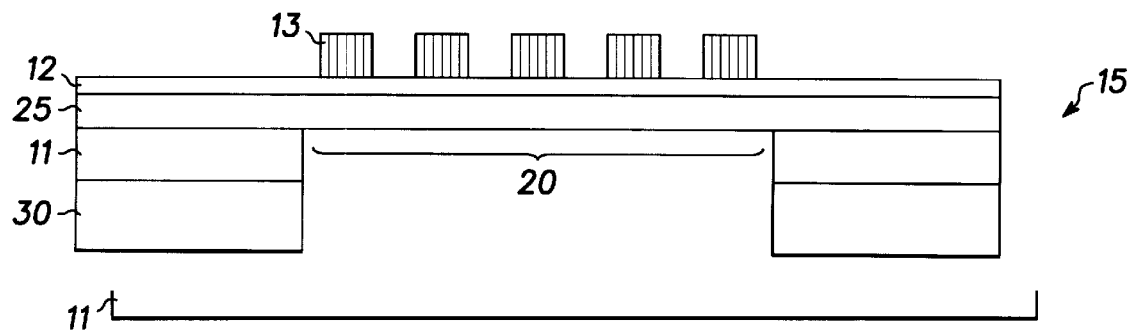
FIGS. 1 and 2 are simplified sectional views of steps in a process of forming an X-ray mask in accordance with the present invention.
Figure 2:
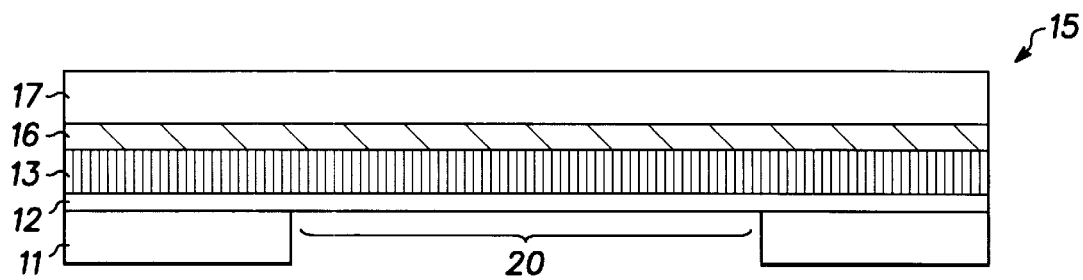

Turning now to the drawings, FIGS. 1 and 2 are simplified sectional views of steps in a process of forming refractory X-ray masks, such as X-ray mask 10, in accordance with the present invention. Mask 10 includes a supporting member 11 which is referred to herein as a "wafer". For convenience and because semiconductor tools and equipment are generally utilized in the fabrication and use processes, supporting member 11 will be a semiconductor wafer, such as a silicon wafer. Also, the wafer commonly used by today's manufacturers is a silicon wafer 76 mm in diameter and 2 mm thick. However, it should be understood that other members, materials, and sizes might be utilized and the term "wafer" is intended to encompass all such members.

A membrane layer 12 is formed on a planar upper surface of supporting member 11 by any convenient method, including epitaxial growth, deposition, etc. Generally, membrane layer 12 is formed of some convenient material, such as silicon (Si), silicon nitride (SiN), or silicon carbide (SiC), or the like. Also, when membrane layer 12 is formed on supporting member 11 it is formed with tension. For the specific example used herein, this tension or stress is approximately 200 MPa* μm (a unit of membrane equivalent force). In combination with the present novel fabrication methods, it has been found that for uniform stress (dominated by stressed membrane layer 12), resulting distortions, to be explained below, are affected by the magnitude of the stress in membrane layer 12, the size of membrane layer 12, and the thickness of supporting member 11. The material used for membrane layer 12 does not have a significant effect on the resulting distortions. As is understood by those skilled in the art, it is only necessary that membrane layer 12 be of a material and thickness such that it is transparent to X-rays during use of the mask.

A layer 13 of X-ray absorbing material is deposited on the surface of membrane layer 12. Generally, the X-ray absorbing material may be any convenient material which will absorb X-rays passing through membrane layer 12 so as to prevent the X-rays from passing on through layer 13. Materials such as tantalum-silicon nitride (TaSiN), tantalum-boride ($Ta_4B$), etc. are commonly used. In the present example, layer 13 is deposited and treated with a thermal anneal to control stresses in layer 13.

An etch mask 15 is formed on the upper surface of layer 13 for the purpose of transferring a chosen pattern to layer 13, as will be explained in more detail below. While etch mask 15 may be formed using a wide variety of methods and materials, all well known in the art, in this embodiment etch mask 15 includes a hard mask layer 16 and a photoresist layer 17. Generally, photoresist layer 17 of etch mask 15 is formed of any convenient material on which can easily be written the chosen pattern, for example with an electron beam (E-beam) device or the like. After the chosen pattern is formed in photoresist layer 17, hard mask layer 16 is etched to transfer the pattern thereto, using photoresist layer 17 as a mask.

As will be understood by those skilled in the art, photoresist material is generally not strong enough to be used as an etch mask for etching the chosen pattern in layer 13. Thus, hard mask layer 16 is included in etch mask 15 to form a sufficiently serviceable mask for the etching of layer 13 and may be formed of any convenient material with a substantially different etch rate or which requires different etch materials, such as a very thin layer of metal (e.g. chromium or $SiO_2$) or the like. Etch mask 15 (both layers 16 and 17) are removable so that once the chosen pattern has been transferred to layer 13 etch mask 15 can be easily removed.

Referring to FIG. 2, a portion of wafer 11 is removed exposing a portion of the lower surface, or membrane area 20, of membrane layer 12, thereby essentially forming membrane layer 12 into a membrane. Membrane area 20 may have substantially any desired configuration but in a preferred embodiment will be rectangular. Round membranes have a very simple relationship between position on the membrane and the corresponding distortion, however they suffer large errors from unequal exposure (a portion of the membrane area does not get exposed to X-rays and this difference causes distortions in the thin film). Square membranes fix the problems associated with round membranes, however they have a complicated distortion problem. Generally, this disclosure includes a unique function that accurately describes the movement of patterns on a square (rectangular) membrane but the function can be adapted to other shaped membranes in some applications.

In the wafer flow, the portion of wafer 11 is removed to expose wafer area 20 after the chosen pattern has been transferred to X-ray absorbing layer 13. In the membrane flow, the portion of wafer 11 is removed to expose wafer area 20 before the chosen pattern is transferred to X-ray absorbing layer 13. While the present novel method is most applicable to the wafer flow, it will be understood that it is also applicable to the membrane flow in some special instances, or to any modified types of flow.

Figure 3:
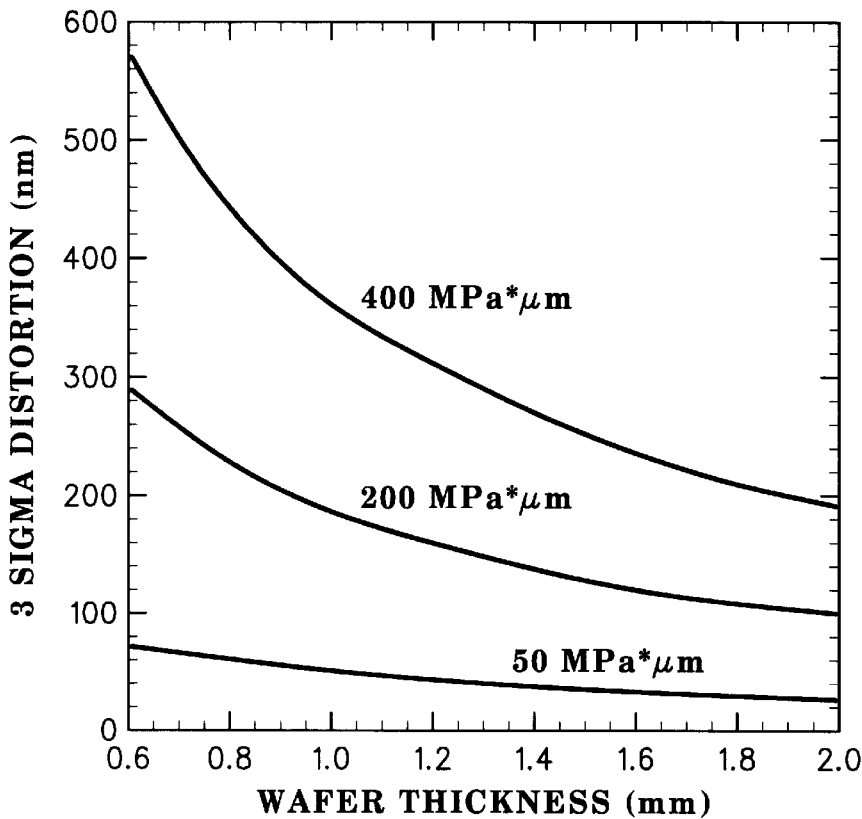
FIG. 3, illustrates a plot of the theoretically calculated 3σ distortion versus wafer thickness for three membrane equivalent forces using a 25 mm square membrane area.
Figure 4:
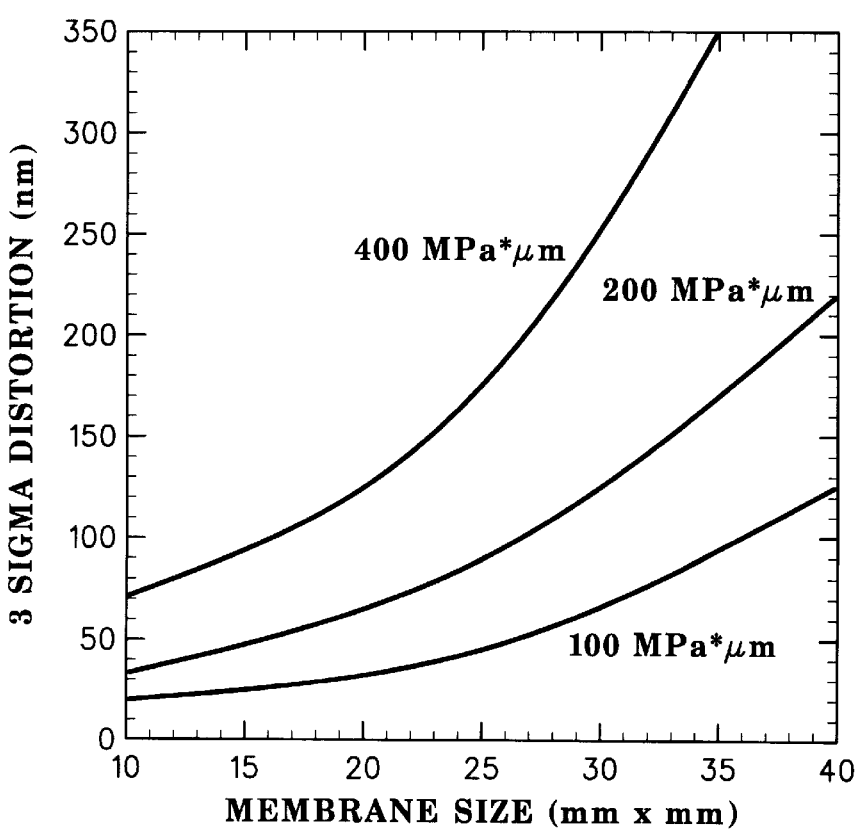
FIG. 4 is a plot of the same 3σ distortion versus membrane size that is illustrated in FIG. 3, using a 2 mm thick silicon wafer.

As described above, the major problem that arises is the stresses in the various layers. Because of these stresses, the creation of the membrane and the mounting of the wafer create significant pattern placement errors in the final X-ray mask. As described above, when membrane layer 12 is formed on supporting member 11 it is formed with approximately 200 MPa* μm of tension. Also, for uniform stress (dominated by stressed membrane layer 12), resulting distortions are affected by the magnitude of the stress in membrane layer 12, the size of membrane layer 12, and the thickness of supporting member 11. The material used for membrane layer 12 does not have a significant effect on the resulting distortions. Referring to FIG. 3, a plot of the theoretically calculated 3σ distortion versus wafer thickness for three membrane equivalent forces using a 25 mm square membrane area is illustrated. FIG. 4 is a plot of the same 3σ distortion versus membrane size using a 2 mm thick silicon wafer. As is clearly evident from FIGS. 3 and 4, the errors for the wafer flow will be large for any usable combination of membrane size and stress, even in the best case of 2 mm thick silicon wafers.

Figure 5:
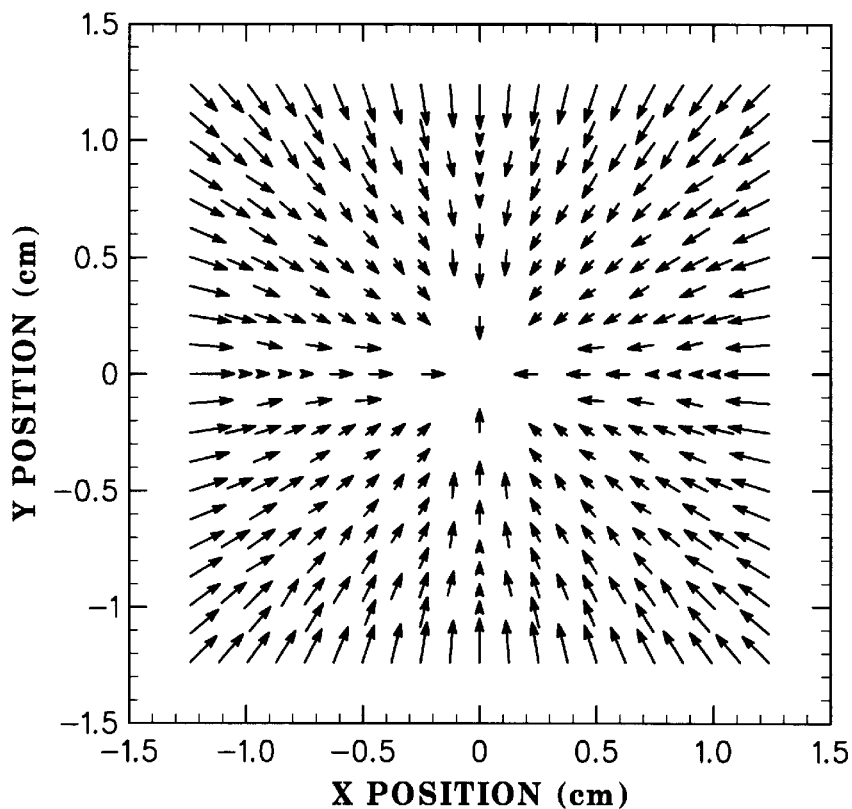
FIG. 5 illustrates a theoretical distortion pattern that is produced by the creation of a rectangular membrane.
Figure 6:
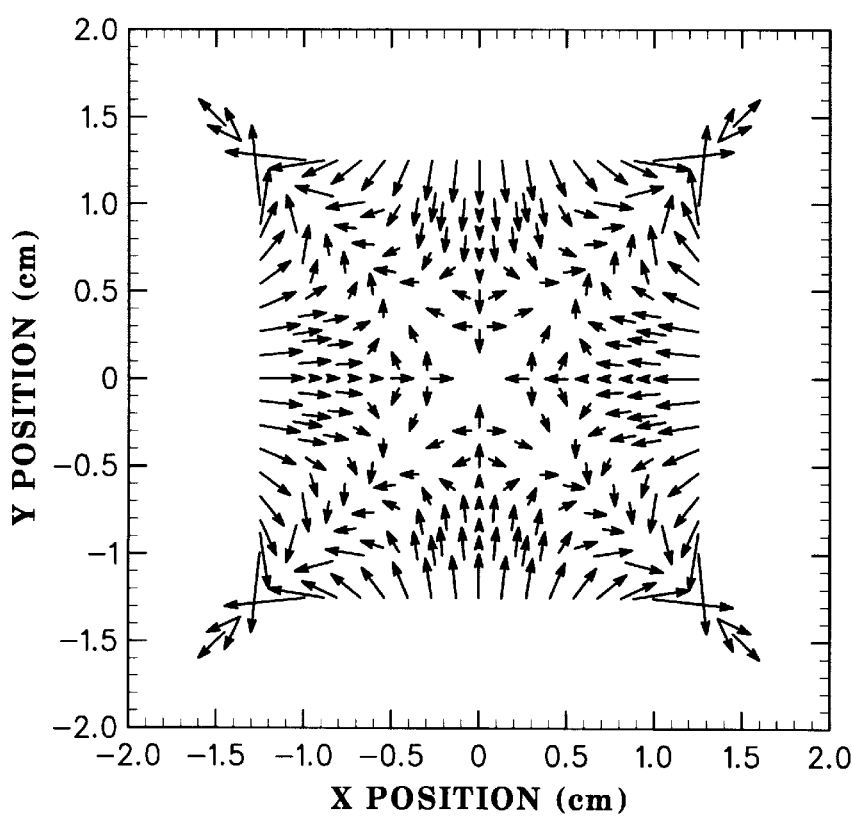
FIG. 6 illustrates theoretical distortions remaining after the magnification component of the distortion errors has been removed.

The solution to the distortions that occur from membrane formation is to estimate the pattern shifts and predistort the written pattern during the electron beam lithography. This predistortion then cancels the distortion from membrane formation and the X-ray mask has excellent pattern placement values. Turning now to FIG. 5, a theoretical distortion pattern is illustrated that is produced by the creation of a square membrane area. The arrows represent magnitude and direction of the distortions. FIG. 6 illustrates the distortions remaining after the magnification component is removed. While this procedure corrects nearly 80% of the distortion errors involved, additional corrections are still necessary to obtain X-ray masks that meet the desired pattern placement specifications. FIG. 6 is expanded by approximately a factor of five over the distortion pattern of FIG. 5, to more clearly illustrate the remaining or residual errors.

As will be understood by those skilled in the art, when a pattern is formed in the photoresist layer 17 of FIG. 1, the electron beam produces the pattern by forming a series of pixels (picture elements, similar to a television picture), each of which can be identified by a unique position along the X and Y axes. Generally the electron beam device is controlled by a program which determines the X and Y positions of each pixel and whether material (photoresist) at that point is to remain or be removed. The pattern is predistorted by introducing into the program a change of position equal and opposite to errors $\Delta X$ and $\Delta Y$, so that the pixel position is changed, or predistorted, after which the actual error moves the pixel back to the desired position.

A model has been developed which accurately accounts for at least 99% of the error that is produced by the square shape of membrane area 20. This model is based on the discovery that the remaining residue errors (after magnification is removed) have a symmetry that allows many terms in a fourth order polynomial fit to be ignored. The errors ($\Delta X$, $\Delta Y$) are fit with variables as follows:

$$\Delta Y = M_y Y + \delta Y$$

$$\Delta X = M_x X + \delta X$$

where:

$M_y$ and $M_x$ are the X and Y magnification errors, respectively, and X and Y define a position on the mask;

$\delta Y$ includes the terms $\alpha X^4 + \beta X^2 + \gamma$ where, $\alpha$ includes the terms $a_1 Y^3 + a_2 Y$ $\beta$ includes the terms $a_3 Y^3 + a_4 Y$ $\gamma$ includes the terms $a_5 Y^3 + a_6 Y$; and $\delta X$ includes the terms $\alpha' Y^4 + \beta' Y^2 + \gamma$ where, $\alpha'$ includes the terms $a_7 X^3 + a_8 X$ $\beta'$ includes the terms $a_9 X^3 + a_{10} X$ $\gamma$ includes the terms $a_{11} X^3 + a_{12} X$ ($a_1$ through $a_{12}$ are constants).

This equation is easily extendible if more accurate corrections are needed (for example 99.9% or 99.99% etc.). This is done by adding terms to either the $\alpha$, $\beta$ and $\gamma$ or the $\delta$ (including both the X and Y terms). The next set of corrections would look like $\alpha = a_1 Y^5 + a_2 Y^3 + a_3 Y$ (odd powers of Y etc.) and $\delta Y = \alpha X^6 + \beta X^4 + \gamma X^2 + \epsilon$ (even powers of X and $\epsilon = a_4 Y^5 + a_5 Y^3 + a_6 Y$ etc.). The actual variables are not important but the method of getting the best model to fit with the minimum number of variables is important. For purposes of this disclosure, only the basic formula is expressed but it should be understood that any and all extensions which might be utilized are included as a portion of this invention.

Finite element modeling coupled with experimental verification is used to provide the material and process conditions for obtaining the desired pattern placement accuracy. In this specific example, structural finite element modeling of the X-ray mask was created using a commercially available finite element code ANSYS$^R$. The finite element modeling allows the division of a complex structure, like an X-ray mask, into smaller elements which are easier to analyze. Once appropriate boundary conditions are established, a piecewise continuous solution is generated from the series of simultaneous equations.

As an example, from FIG. 4 it can be seen that a 25 mm square membrane with a 200 MPa* $\mu$m membrane equivalent force has a calculated $3\sigma$ distortion of 90 nm. Magnification correction reduces this error to 19 nm, however the additional (residual) corrections described above reduce the square shape error to only 1 nm. The technique of pre-pattern distortion has been shown to work quite well however it does require repeatability in the membrane stress (and thickness), size and wafer thickness. Suppose, for example, each error component was to be ±5 nm or less, then from FIGS. 3 and 4 (200 MPa* $\mu$m, 2 mm thick and 25 mm square membrane) the specifications for the silicon wafer thickness must be 2±0.12 mm in thickness, the membrane size must be 25±0.8 mm and the stress thickness of the membrane must be 200±11 MPa* $\mu$m. There are other errors that might be present in the flow (e.g. mounting and E-beam lithography can each cause from >0.1 down to 0.03 $\mu$m distortion) and these will dictate stringent requirements on the X-ray mask properties.

Thus, values for the constants $a_1$ through $a_{12}$ in the above equations can be estimated initially using any of a variety of programs. Then, keeping the variables, such as the size and thickness of membrane layer 12 and the thickness of wafer 11, constant, the values of $a_1$ through $a_{12}$ are adjusted by inspection until the desired pattern position is achieved.

Figure 7:
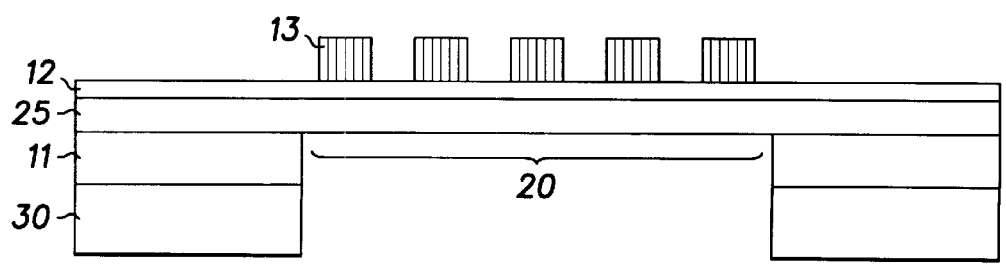
FIG. 7 is a simplified sectional view of a completed X-ray mask fabricated in accordance with the present invention.

Referring specifically to FIG. 7, a simplified sectional view of completed X-ray mask 10 is illustrated. Mask 10 includes layer 13 of X-ray absorbing material with a chosen pattern formed therein. Patterned layer 13 is positioned on membrane layer 12, which in this instances is illustrated with a layer 25 of silicon carbide (SiC) included. It has been found that SiC reduces distortions due to film stress gradients, however the frame structure determines the distortions from a film's mean stress. Layer 25 is positioned on the upper surface of wafer 11, which has been etched to expose membrane area 20. Wafer 11 is further positioned on a ring support 30, which is generally constructed of glass, Pyrex, etc. and provides additional support needed for the use of X-ray mask 10.

Thus, new and improved methods of fabricating X-ray masks have been disclosed, which new and improved methods compensate for residual errors so as to greatly improve the accuracy. Further, the new and improved methods of fabricating X-ray masks include the use of a new function which can accurately describe the movement expected from all parts of a rectangular membrane in a simple closed form.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A method of fabricating an X-ray mask with reduced errors comprising the steps of:

providing a wafer with a planar surface;

forming a membrane layer on the planar surface of the wafer;

forming a layer of X-ray absorbing material on the membrane layer;

defining a pattern on the layer of X-ray absorbing material, which pattern has portions with positions that are predistorted in accordance with the following equations:

$$\Delta Y = M_y Y + \delta Y$$

$$\Delta X = M_x X + \delta X$$

where:

$M_y$ and $M_x$ are the X and Y magnification errors, respectively, and X and Y define a position on the mask;

$\delta Y$ includes the terms $\alpha X^4+\beta X^2+\gamma$ where,
  $\alpha$ includes the terms $a_1 Y^3+a_2 Y$
  $\beta$ includes the terms $a_3 Y^3+a_4 Y$
  $\gamma$ includes the terms $a_5 Y^3+a_6 Y$; and $\delta X$ includes the terms $\alpha' Y^4+\beta' Y^2+\gamma$ where,
  $\alpha'$ includes the terms $a_7 X^3+a_8 X$
  $\beta'$ includes the terms $a_9 X^3+a_{10} X$
  $\gamma$ includes the terms $a_{11} X^3+a_{12} X$
  ($a_1$ through $a_{12}$ are constants)

forming the pattern through the layer of X-ray absorbing material to form an X-ray mask.

2. A method of fabricating an X-ray mask with reduced errors as claimed in claim 1 wherein the step of forming the membrane layer includes prestressing the membrane layer with tension stress.

3. A method of fabricating an X-ray mask with reduced errors as claimed in claim 1 including in addition a step of defining a rectangular membrane area on the membrane layer and the layer of X-ray absorbing material with the pattern being defined within the rectangular membrane area.

4. A method of fabricating an X-ray mask with reduced errors as claimed in claim 3 including in addition a step of removing a portion of the wafer adjacent and coextensive with the rectangular membrane area subsequent to the step of forming the pattern through the layer of X-ray absorbing material.

5. A method of fabricating an X-ray mask with reduced errors as claimed in claim 3 including in addition a step of removing a portion of the wafer adjacent and coextensive with the rectangular membrane area prior to the step of forming the pattern through the layer of X-ray absorbing material.

6. A method of fabricating an X-ray mask with reduced errors as claimed in claim 1 wherein the step of forming the pattern through the layer of X-ray absorbing material includes removing portions of the layer of X-ray absorbing material by etching the layer of X-ray absorbing material to form the pattern.

7. A method of fabricating an X-ray mask with reduced errors as claimed in claim 6 wherein the step of defining the pattern on the layer of X-ray absorbing material includes the steps of depositing a hard mask layer on the layer of X-ray absorbing material and a layer of photoresist on the hard mask layer, writing the pattern in the layer of photoresist, and etching the pattern in the hard mask layer to form an etch mask for etching the layer of X-ray absorbing material.

8. A method of fabricating an X-ray mask with reduced errors as claimed in claim 7 wherein the step of writing the pattern in the layer of photoresist includes using an electron beam device to write the pattern.

9. A method of fabricating an X-ray mask with reduced errors comprising the steps of:

providing a wafer with a planar surface;

forming a membrane layer on the planar surface of the wafer;

forming a layer of X-ray absorbing material on the membrane layer;

defining a pattern on the layer of X-ray absorbing material, which pattern has portions with positions that are predistorted in accordance with the following equations:

$$\Delta Y = M_y Y + \delta Y$$

$$\Delta X = M_x X + \delta X$$

where:

$M_y$ and $M_x$ are the X and Y magnification errors, respectively, and X and Y define a position on the mask;

$\Delta Y$ includes the terms $\alpha X^4+\beta X^2+\gamma$ where,
  $\alpha$ includes the terms $a_1 Y^3+a_2 Y$
  $\beta$ includes the terms $a_3 Y^3+a_4 Y$
  includes the terms $a_5 Y^3+a_6 Y$; and $\Delta X$ includes the terms $\alpha' Y^4+\beta' Y^2+\gamma$ where,
  $\alpha'$ includes the terms $a_7 X^3+a_8 X$
  $\beta'$ includes the terms $a_9 X^3+a_{10} X$
  $\gamma$ includes the terms $a_{11} X^3+a_{12} X$
  ($a_1$ through $a_{12}$ are constants)

forming the pattern through the layer of X-ray absorbing material; and forming a centrally located, rectangularly shaped opening through the wafer to define a rectangular membrane area on the membrane layer, the rectangular membrane area including the pattern.

10. A method of fabricating an X-ray mask with reduced errors comprising the steps of:

providing a wafer with a planar surface;

forming a membrane layer on the planar surface of the wafer;

forming a layer of X-ray absorbing material on the membrane layer;

depositing a hard mask layer on the layer of X-ray absorbing material;

depositing a layer of photoresist material on the hard mask layer;

defining a pattern in the layer of photoresist material in the rectangular membrane area, which pattern has portions with positions that are predistorted in accordance with the following equations:

$$\Delta Y = M_y Y + \delta Y$$

$$\Delta X = M_x X + \delta X$$

where:

$M_y$ and $M_x$ are the X and Y magnification errors, respectively, and X and Y define a position on the mask;

$\Delta Y$ includes the terms $\alpha X^4+\beta X^2+\gamma$ where,
  $\alpha$ includes the terms $a_1 Y^3+a_2 Y$
  $\beta$ includes the terms $a_3 Y^3+a_4 Y$
  $\gamma$ includes the terms $a_5 Y^3+a_6 Y$; and $\Delta X$ includes the terms $\alpha' Y^4+\beta' Y^2+\gamma$ where,
  $\alpha'$ includes the terms $a_7 X^3+a_8 X$
  $\beta'$ includes the terms $a_9 X^3+a_{10} X$
  $\gamma$ includes the terms $a_{11} X^3+a_{12} X$
  ($a_1$ through $a_{12}$ are constants).

etching the pattern in the hard mask layer, using the layer of photoresist material with the pattern defined therein;

etching the pattern through the layer of X-ray absorbing material, using the pattern in the hard mask layer; and forming a centrally located, rectangularly shaped opening through the wafer to define a rectangular membrane area on the membrane layer.

* * * * *

UNITED STATES PATENT AND TRADEMARK OFFICE
CERTIFICATE OF CORRECTION

PATENT NO.   : 6,007,948
DATED        : December 28, 1999
INVENTOR(S)  : Kevin D. Cummings Page 1 of 1

It is certified that error appears in the above-identified patent and that said Letters Patent is hereby corrected as shown below:

<u>Column 8,</u>
Lines 8 and 46, delete "$\Delta Y$" and replace with -- $\delta Y$ --.
Line 11, add "$\gamma$" in front of includes.
Lines 12 and 50, delete "$\Delta X$" and replace with -- $\delta X$ --.
Lines 12, 15, 50 and 53, delete "$\gamma$" and replace with -- $\gamma`$ --.

Signed and Sealed this

Twenty-eighth Day of May, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO.    : 6,007,948
DATED         : December 28, 1999
INVENTOR(S)   : Kevin D. Cummings It is certified that error appears in the above-identified patent and that said Letters Patent is hereby corrected as shown below:

Column 7,
Lines 8 & 11, delete "$\gamma$" and replace with -- $\gamma'$ --.

Column 8,
Line 8, delete "$\Delta Y$" and replace with -- $\delta Y$ --.
Line 11, add "$\gamma$" in front of includes.
Line 12, delete "$\Delta X$" and replace with -- $\delta X$ --.
Line 12, delete "$\gamma$" and replace with -- $\gamma'$ --.
Line 15, delete "$\gamma$" and replace with -- $\gamma'$ --.
Line 48, delete "$\Delta Y$" and replace with -- $\delta Y$ --.
Line 52, delete "$\Delta X$" and replace with -- $\delta X$ --.
Lines 52 & 55, delete "$\gamma$" and replace with -- $\gamma'$ --.

Signed and Sealed this

Twenty-seventh Day of August, 2002

*Attest:*

JAMES E. ROGAN
*Attesting Officer*            *Director of the United States Patent and Trademark Office*